United States Patent [19]

Schrader

[11] Patent Number: 4,682,369
[45] Date of Patent: Jul. 21, 1987

[54] RIPPLE AND DROOP REDUCTION CIRCUIT

[75] Inventor: Elliott G. Schrader, Garland, Tex.

[73] Assignee: Texas Instruments Incorporated, Dallas, Tex.

[21] Appl. No.: 707,938

[22] Filed: Mar. 4, 1985

[51] Int. Cl.$^4$ .............................................. H04B 1/04
[52] U.S. Cl. ..................................... 455/127; 363/46; 315/105
[58] Field of Search ................... 315/3.5, 105; 330/43; 331/82; 363/39, 45, 46; 455/127

[56] References Cited

U.S. PATENT DOCUMENTS

| | | | |
|---|---|---|---|
| 3,283,252 | 11/1966 | Mead, Jr. et al. | 455/127 |
| 3,550,030 | 12/1970 | Blanyer | 330/199 |
| 3,551,780 | 12/1970 | Gautherin | 363/46 |
| 3,796,965 | 3/1974 | Quesinberry et al. | 330/43 |
| 4,000,471 | 12/1976 | Pankow | 328/175 |
| 4,323,853 | 4/1982 | Kurokawa | 330/43 |

OTHER PUBLICATIONS

"Circuit Ideas: Reducing Power Supply Ripple", by A. Bartram, from *Wireless World* (May 1981).

*Primary Examiner*—Samuel Scott
*Assistant Examiner*—Allen J. Flanigan
*Attorney, Agent, or Firm*—Richard K. Robinson; James T. Comfort; Melvin Sharp

[57] ABSTRACT

A radar transmitter includes a ripple and droop reduction circuit to reduce the ripple and droop of the beam (power) supply. A beam supply filter capacitor is connected to the source of power and an operational amplifier has its balanced input ac connected across the beam supply capacitor. A transistorized amplifier stage inverts the signal from the operational amplifier and amplifies its absolute value up to the same level appearing across the beam supply filter capacitor. A transistorized follower stage is connected to the transistorized amplifier stage for receiving the inverted signal and producing a low impedance output for insertion in series with the beam supply filter capacitor for ripple and droop cancellation. A traveling-wave-tube is connected to the supply power capacitor which receives the ripple and droop free capacitor output and produces substantially consistent pulses for transmission.

7 Claims, 6 Drawing Figures

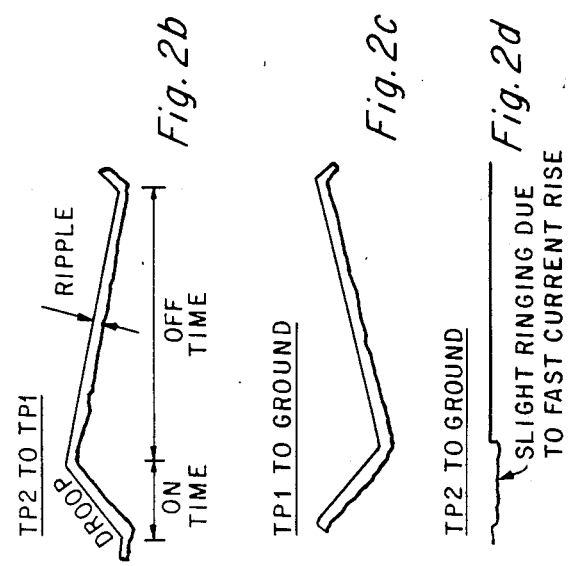
Fig. 2b
Fig. 2c
Fig. 2d
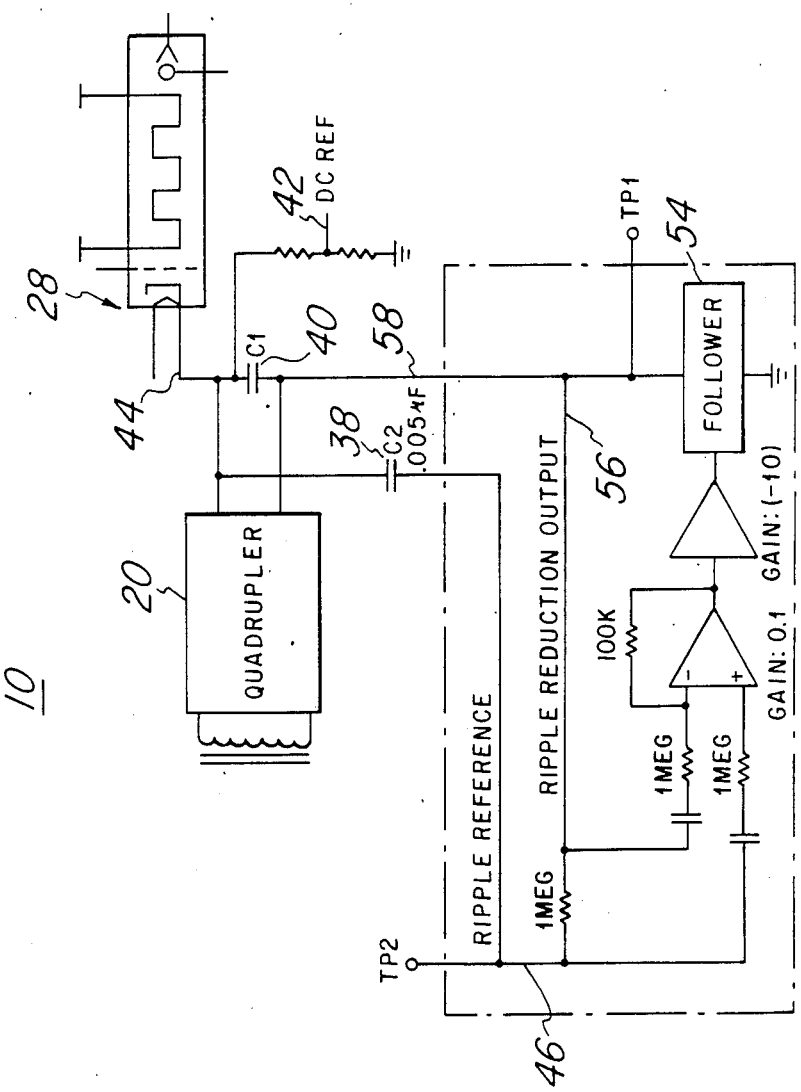
Fig. 2a

4,682,369

RIPPLE AND DROOP REDUCTION CIRCUIT

BACKGROUND OF THE INVENTION

This invention relates to radars and more particularly to a transmitter, having a ripple and droop reduction circuit, for moving target indicator radars and pulse Doppler radars.

In a grid pulsed, depressed collector traveling-wave-tube (TWT) microwave amplifier or Klystron amplifier, the beam velocity is a function of the voltage from cathode to ground or body (beam voltage), and any change in voltage results in a corresponding RF phase shift through the tube. Thus, any power supply ripple appearing across the power supply capacitor will cause phase modulation of the amplified pulses. In many critical radar applications, excessive phase modulation of the output is highly undesirable.

In addition to the pulse-to-pulse phase changes caused by power supply ripple, there are phase and amplitude changes caused by the discharge of the power supply capacitor during the pulse.

In moving target indicator radars, and pulse Doppler radars the output pulses of the TWT amplifier must be substantially identical, in order that any variations in the return pulses are the result of the environment outside the radar.

In the past, the undesired ripple and droop in the beam supply was reduced by increasing substantially the size of the power supply capacitor. The problems attending the use of such a capacitor were the increased size and cost of the capacitor and the large amount of energy stored therein. As a rule of thumb, if the stored energy exceeds 50 joules, damage to the TWT results from tube arcing, unless a fast acting, expensive "electronic crowbar" circuit is provided. Also, in the past, a series regulation circuit was used to reduce the ripple and droop in the beam supply. A major problem with the series regulation circuit lies in obtaining good stability in the high gain, wide band amplifier and its associated sensing circuitry. The high voltages and high noise levels present in transmitter enclosures magnify this problem.

Accordingly, it is an object of the present invention to improve radars of the type using TWT of Klystron tube amplifiers.

Another object of the invention is to provide radars using TWTs or Klystron tube amplifiers with ripple and droop reduction circuits which are small, light and inexpensive to manufacture.

Still another object of the invention is to provide a ripple and droop reduction circuit having a gain of about one at the mid-range frequencies and less than one at other frequencies to negate any stabilization or oscillation problems.

Yet another object of the invention is to provide a ripple and droop reduction circuit in which the dc reference or supply voltages are not critical to its operation.

A further object of the invention is to provide a ripple and droop reduction circuit having inherent low gain and stability for operation remote from the high voltage compartment.

Briefly stated the invention comprises a ripple and droop reduction circuit for generating a ripple voltage substantially equal to but opposite in sign to the ripple voltage of the power supply for substantial cancellation of the ripple voltage effects on the stream of electrons in the TWT whereby the output pulses of the TWT have substantially the same characteristics.

Other objects and features of the invention will become more readily apparent from the following detailed description when read in conjunction with the accompanying drawings, in which:

BRIEF DESCRIPTION OF THE DRAWINGS

FIG. 2a is a drawing partly in block form and partly in schematic form of the grid pulsed, depressed collector traveling-wave-tube microwave amplifier constituting the subject matter of this invention;

FIGS. 2b–2d are drawings of the signals at various points of the ripple and droop reduction circuit of the TWT microwave amplifier.

DETAILED DESCRIPTION OF THE EMBODIMENTS

Figure 1:
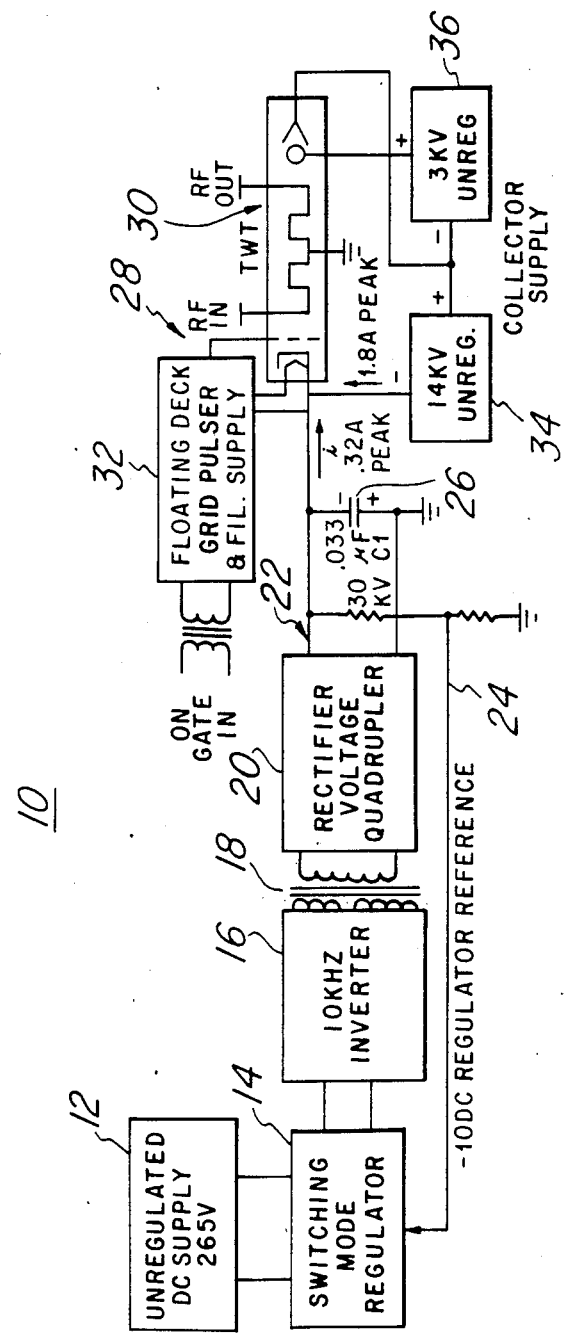
FIG. 1 is a drawing partly in block and schematic form of a prior art grid pulsed, depressed collector traveling-wave-tube (TWT) microwave amplifier.

The prior art grid pulsed, depressed collector traveling-wave-tube (TWT) microwave amplifier 10 includes an unregulated dc power supply 12. A switching mode regulator 14 is connected to the dc power supply for converting the dc to ac for an inverter 16 including the primary coils of transformer 18. Transformer 18 has its secondary coil, which quadruples the ac voltage, connected to a voltage rectifier 20. A power divider 22 provides a selected dc regulator reference voltage through lead 24 to the regulator 14 and a high voltage (30 KV) across a power supply capacitor 26. Power capacitor 26 is made large enough to reduce the droop and ripple of the beam supply sufficiently for use in non-critical applications. The negative plate of the capacitor 26 is connected to the cathode of an electron tube 28. A floating deck grid pulser and filament supply 32 is connected to the grid and filament of tube 28. The collector of tube 28 is powered by collector supplies 34 and 36.

Referring now to FIG. 2, the grid pulsed, depressed collector traveling-wave-tube (TWT) microwave amplifier 10 includes the power supply means 12, 14, 16 and 18 (FIG. 1) and quadrupler 20. The quadrupler 20 is connected to the junction of ripple reference capacitor 38, power supply capacitor 40, dc reference 42 and cathode 44 of electron tube 28 of TWT 28. Capacitor 40 differs from capacitor 26 (FIG. 1) in size. The ripple reference capacitor 38 (FIG. 2) is connected by lead 46 to the positive input terminal of operational amplifier (Op Amp) 50 of power ripple and droop reduction circuit 48. An inverter amplifier 52 is connected to receive the output of the Op Amp 50 and an emitter follower circuit 54 is connected to receive the inverted output of inverter 52. The emitter follower 54 is connected to the junction leads 56 and 58 connected, respectively, to the negative input terminal of Op Amp 50 and lower plate of the power supply capacitor 40.

In operation, the balanced input of the operational amplifier is ac connected across the power (beam supply filter capacitor) supply capacitor. The difference between the ripple and droop reference voltage applied to the positive terminal of the operational amplifier 50 and the ripple reduction output of the follower circuit 54 applied to the negative terminal, which is a low level, single ended version of the ac ripple and droop appearing across the power supply capacitor, is outputted with a gain of 0.1 to the inverter amplifier 52. The inverter amplifier 52 inverts the difference signal with a gain of minus ten to the follower 54. Thus, the output of the inverter amplifier is an inverted image of the ac across the power supply capacitor. The ripple and droop output of the output of the inverter amplifier is passed through the follower with a low impedance output and inserted in series with the power supply capacitor. Thus, the ac component of the voltage between the TWT cathode and ground is reduced substantially. This result is substantiated by connecting an oscilloscope to test point two (TP2) and to test point one (TP1) to display the ripple and droop curve of FIG. 2b, to TP1 and to ground to display the ripple and droop curve of FIG. 2c and to TP2 and to ground to display the output curve of FIG. 2c. It is to be noted that only a slight ringing (FIG. 2d) effect remains; the important thing is that the output of the TWT pulses are substantially the same regardless of any irregularity of the power source. Thus, any variations to the pulse returns are attributable to factors generated outside the radar.

Figure 3:
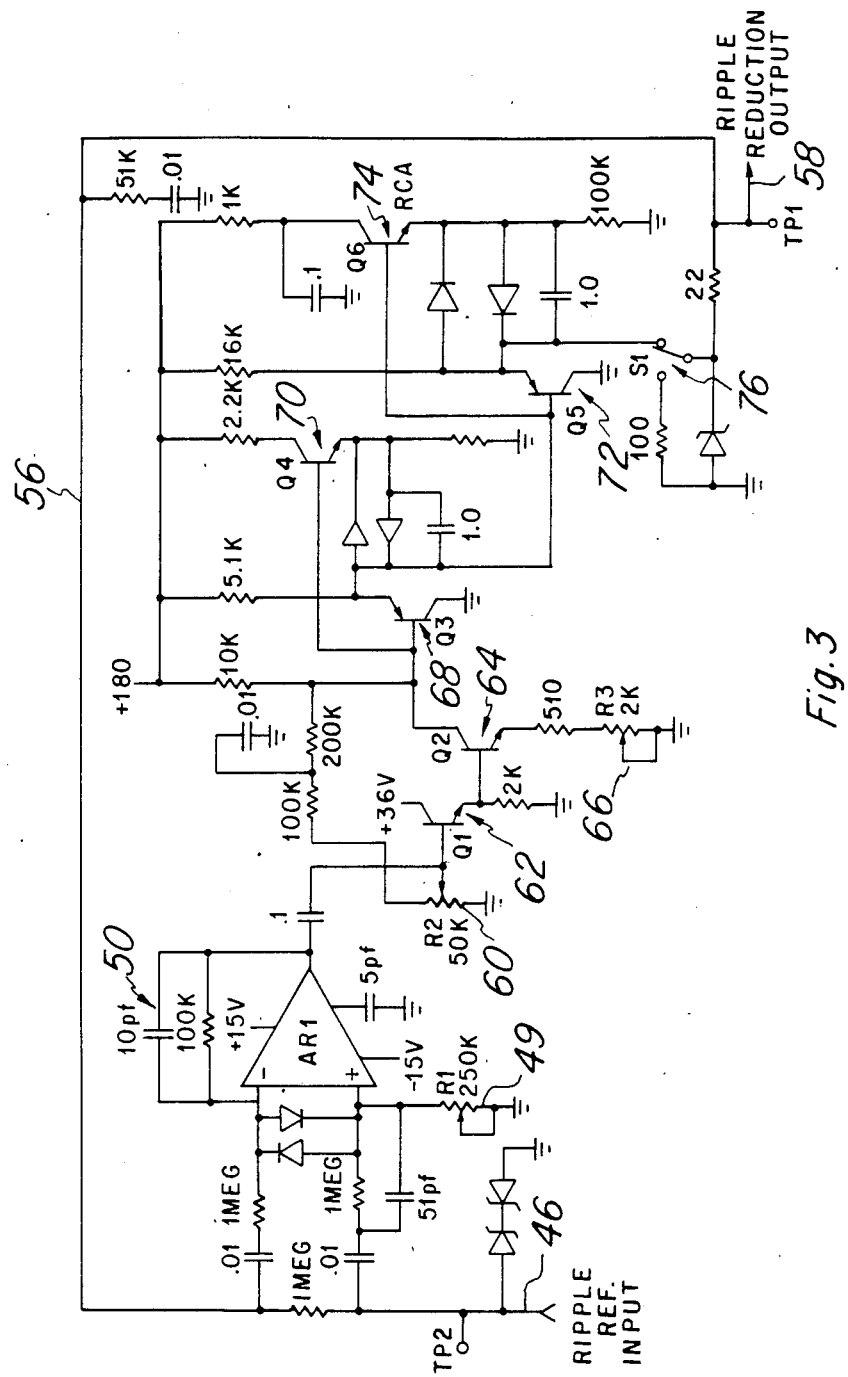
FIG. 3 is a schematic diagram of the ripple and droop reduction circuit of the grid pulsed, depressed collector traveling-wave-tube microwave amplifier of FIG. 2.

Referring now to FIG. 3, a detailed ripple and droop reduction circuit 48 design includes ripple reference capacitor lead 46 connected to the junction of TP2 and the positive input terminal of operational amplifier 50. Operational amplifier 50 is a Harris Corportion HA 7-2522 Op Amp configured with a potentiometer 49 for common mode rejection operation to amplify only the ripple and droop signals. The high value input resistors protect the amplifier input, and the gain is set at a value consistent with the value of the ac voltage across the beam (power) supply filter capacitor and the output capabilities of the operational amplifier. The output of the operational amplifier is connected to the operating point selector potentiometer 60 and base of transistor 62. Transistor 62 is a Motorola Company 2N2222A transistor.

Transistor 62 has its emitter connected to the base of transistor amplifier 64 which has its emitter connected to gain control potentiometer 66 for multiplying the 0.1 gain of the Op Amp by 10 gain and inverting it to a $-1$ gain. Transistor 64 is a Motorola Company 2N3439 transistor. The collector of transistor 64 is connected to the junction of the bases of the first stage emitter follower transistors 68 and 70, which are, respectively Motorola Company 2N5416 and 2N3439 NPN and PNP transistors. Transistors 68 and 70 have their emitters connected together through reverse diodes and a capacitor as shown and the output of the transistor turned on is connected to the bases of transistors 72 and 74. The reverse diodes are operative to admit the output of either transistor 68 or 70, whichever is turned on by the ac, to the bases of NPN and PNP transistors 72 and 74 and the capacitor is to smooth their on/off transition. Transistors 72 and 74 form the second follower stage and are, respectively, a Motorola 2N6214 and an RCA 40851 transistors. The emitters of 72 and 74 are connected together as described for the first follower stage and need not be repeated.

The output of the second follower stage is connected to the negative terminal of the operational amplifier 50 and to the power supply capacitor 40 (FIG. 2a) through switch 76. Switch 76 is for connecting the ripple and droop reduction circuit in and out of the TWT power circuit, thereby permitting a check of the ripple and droop reduction circuit operation.

Although only a single embodiment of this invention has been described, it will be apparent to a person skilled in the art that various modifications to the details of construction shown and described may be made without departing from the scope of this invention.

What is claimed is:

1. A ripple reduction circuit for a radar transmitter, comprising:
    (a) power supply means having a supply output;
    (b) supply capacitor means having first and second electrodes and coupled across said supply output;
    (c) ripple and droop reduction means comprising;
    (d) first means including an operational amplifier having a pair of inputs and an output for providing a signal on said output which is a function of the difference between signals on the input thereof;
    (e) ripple reference measuring means coupled between a first electrode of said supply capacitor means and one input of said operational amplifier; and
    (f) ripple reduction means coupled between the second electrode of said supply capacitor means and the other input of said first means including an operational amplifier;
    (g) the output of said first means including an operational amplifier being coupled to said ripple reduction means and said second electrode of said supply capacitor means.

2. The circuit of claim 1 wherein said means including an operational amplifier includes an inverting amplifier coupled to the output of said operational amplifier.

3. The circuit of claim 1 wherein said ripple reference measuring means includes a reference capacitor coupled between said first electrode and said one input.

4. The circuit of claim 2 wherein said ripple reference measuring means includes a reference capacitor coupled between said first electrode and said one input.

5. The circuit of claim 2 wherein said means including an operational amplifier further includes follower means coupled between the output of said inverting amplifier and said second electrode.

6. The circuit of claim 4 wherein said means including an operational amplifier further includes follower means coupled between the output of said inverting amplifier and said second electrode.

7. A radar transmitter comprising:
    (a) a power supply means;
    (b) a power supply capacitor having a first plate operatively connected to the power supply means;
    (c) a ripple and droop reduction means operatively connected to the power supply means across the power supply capacitor to a second plate of the power supply capacitor for reducing substantially the ripple and droop voltages from the power supply capacitor; and
    (d) an electronic tube operatively connected to the power supply capacitor for producing an electron beam for modulation by an RF input single, wherein
    (e) the ripple and droop reduction means comprises a ripple reference obtaining means operatively connected to the power supply, and a ripple reduction means operatively connected to the second plate for reducing substantially the ripple of the power supply when it is off and the droop of the power supply capacitor when the power supply is on, wherein (f) the ripple reduction output means includes an operational amplifier ac connected across the beam supply filter capacitor and outputting a low level, single ended version of the ac ripple and droop appearing across the beam supply filter capacitor, an inverter amplifier means operatively connected to the operational amplifier for inverting its output signal and amplifying its absolute level to that appearing across the beam supply filter capacitor to provide an inverted image of the ac across the beam supply filter capacitor, and a follower means operatively connected to the inverter means for providing a low impedance output for insertion in series with the beam supply filter capacitor whereby the ac component of the voltage between the electronic tube and ground is reduced substantially, wherein (g) the follower means includes at least one stage of emitter follower transistors operatively connected to the inverter means, and wherein (h) the at least one emitter follower stage includes an NPN transistor and a PNP transistor having their bases connected to the inverter amplifier and their emitters connected together through a pair of reversed diodes and a capacitor.

* * * * *